(12) United States Patent
Kim et al.

(10) Patent No.: US 8,233,141 B2
(45) Date of Patent: Jul. 31, 2012

(54) SHUTTER PIXEL, SHUTTER STRUCTURE INCLUDING THE SHUTTER PIXEL, AND EXPOSURE APPARATUS INCLUDING THE SHUTTER STRUCTURE

(75) Inventors: Guk Hyun Kim, Yongin-si (KR); Won-Ki Hong, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 519 days.

(21) Appl. No.: 12/620,398

(22) Filed: Nov. 17, 2009

(65) Prior Publication Data
US 2010/0220307 A1 Sep. 2, 2010

(30) Foreign Application Priority Data
Mar. 2, 2009 (KR) .................. 10-2009-0017725

(51) Int. Cl.
*G03B 27/72* (2006.01)
*G03B 27/54* (2006.01)

(52) U.S. Cl. ............................................. 355/71; 355/67
(58) Field of Classification Search .................... 355/71, 355/67; 359/230
See application file for complete search history.

(56) References Cited

U.S. PATENT DOCUMENTS
2005/0013534 A1* 1/2005 Kazama et al. ................. 385/18
* cited by examiner

*Primary Examiner* — Peter B Kim
(74) *Attorney, Agent, or Firm* — Innovation Counsel LLP

(57) ABSTRACT

The present invention provides a shutter pixel, a shutter structure including the shutter pixel, and an exposure apparatus including the shutter structure. The shutter pixel may include a lower substrate, an electrode disposed on the lower substrate, a spacer disposed on the edge of the electrode, a first mirror disposed on the spacer to be separated from the electrode and including a hole, an upper substrate disposed on the lower substrate to face the lower substrate, and a second mirror disposed at the upper substrate and overlapping the hole. Accordingly, a relatively simple structure may be provided.

20 Claims, 10 Drawing Sheets

SHUTTER PIXEL, SHUTTER STRUCTURE INCLUDING THE SHUTTER PIXEL, AND EXPOSURE APPARATUS INCLUDING THE SHUTTER STRUCTURE

CROSS-REFERENCE TO RELATED APPLICATION

This application claims priority to and the benefit of Korean Patent Application No. 10-2009-0017725 filed in the Korean Intellectual Property Office on Mar. 2, 2009, the entire contents of which are incorporated herein by reference.

BACKGROUND OF THE INVENTION (a) Field of the Invention

An exemplary embodiment of the present invention relates to a shutter pixel, a shutter structure including the shutter pixel, and an exposure apparatus including the shutter structure. In detail, the present invention relates to a shutter pixel used in the exposure field, a shutter structure including the shutter pixel, and an exposure apparatus including the shutter structure.

(b) Description of the Related Art

As the integration degree of electronic elements is increased, an exposure technique required to manufacture the electronic elements is needed. As a result, a digital exposure apparatus that can arbitrarily change the shape of a mask pattern has been developed.

A conventional digital exposure apparatus includes complicated components such as a DMD (digital micro device), an MLA (micro lens array), and an SFA (spatial filter array), and the alignment thereof must be correct to obtain the desired performance.

The cost for manufacturing the exposure apparatus is high due to the complexity of the structure of the digital exposure apparatus. Also, there is an additional complication in that the components must be correctly aligned and maintained in their precise positions to obtain the desired performance.

The above information disclosed in this Background section is only for enhancement of understanding of the background of the invention and therefore it may contain information that does not form the prior art that is already known in this country to a person of ordinary skill in the art.

SUMMARY OF THE INVENTION

An exemplary embodiment of the present invention provides a shutter pixel having a relatively simple structure.

Another exemplary embodiment of the present invention provides a shutter structure including the shutter pixel.

Yet another exemplary embodiment of the present invention provides an exposure apparatus that includes the shutter structure.

According to an exemplary embodiment of the present invention, a shutter pixel includes: a lower substrate; an electrode disposed on the lower substrate; a spacer disposed on the edge of the electrode; a first mirror disposed on the spacer to be separated from the electrode and including a hole; an upper substrate disposed on the lower substrate to face the lower substrate; and a second mirror disposed at the upper substrate and overlapping the hole.

The shutter pixel may further include a voltage application member applying a voltage between the electrode and the first mirror. When a voltage is applied between the electrode and the first mirror, the first mirror may become close to the electrode from the portion where the hole is disposed, thereby forming a concave shape.

The second mirror may be disposed on the surface of the upper substrate facing the lower substrate. When the second mirror is projected on the first mirror, viewed from above in a top plan view, the outer line of the second mirror may be disposed inside the outer line of the first mirror.

The electrode may include a transparent conductive material. A space filter having an opening overlapping the hole of the first mirror and including an opaque material may be further included. The space filter may be disposed between the electrode and the spacer. The opaque material may have an insulating characteristic. The space filter may be disposed between the lower substrate and the electrode. The space filter may be disposed under the lower substrate.

The electrode may include an opaque conductive material, and have an opening overlapping the hole of the first mirror.

According to an exemplary embodiment of the present invention, a shutter structure is provided that includes a plurality of shutter pixels arranged in row and column directions, wherein each shutter pixel includes a lower substrate, an electrode disposed on the lower substrate, a spacer disposed on the edge of the electrode, a first mirror disposed on the spacer to be separated from the electrode and including a hole, an upper substrate on the lower substrate to face the lower substrate, and a second mirror disposed under the upper substrate and overlapping the hole.

In one embodiment of the present invention, the electrodes in the shutter structure may be integrally formed in a flat plate shape, connected to each other, and the first mirrors may be formed to be separated from each other. In another embodiment of the present invention, the electrodes for each of the shutter pixels may be formed to be separated from each other, and the first mirrors may have a shape in which the first mirrors are connected to each other. In yet another embodiment of the present invention the electrodes for each of the shutter pixels in the shutter structure may be formed to be separated from each other, and the first mirrors for each of the shutter pixels may be formed to be separated from each other.

The upper substrates may be integrally formed in a continuous flat plate shape, the lower substrates may be integrally formed in a continuous flat plate shape, and the spacers may be integrally formed on the lower substrate. Each shutter pixel may further include a voltage application member applying a voltage between the electrode and the first mirror.

According to an exemplary embodiment of the present invention, a voltage may be applied between the electrode and the first mirror of the portion selected from the shutter pixels. The first mirror may then become close to the electrode from the portion where the hole is formed, thereby forming a concave shape by the voltage applied between the electrode and the first mirror.

According to an exemplary embodiment of the present invention, an exposure apparatus includes a light source generating collimated light, a shutter structure provided with the collimated light, and a projection lens unit formed under the shutter structure and projecting a focus formed at the shutter structure by the collimated light to an exposure object matter.

According to another exemplary embodiment of the present invention, the structure may be largely simplified in relation to a conventional digital exposure apparatus. Accordingly, it is possible for the structure to be reduced in size and for the manufacturing cost to be further reduced.

Also, differently from a conventional digital exposure apparatus, it is not necessary for the alignment of the components to be measured. The digital exposure apparatus hereby disclosed is controlled in such manner that performance deterioration due to an alignment error may be prevented.

Figure 1:
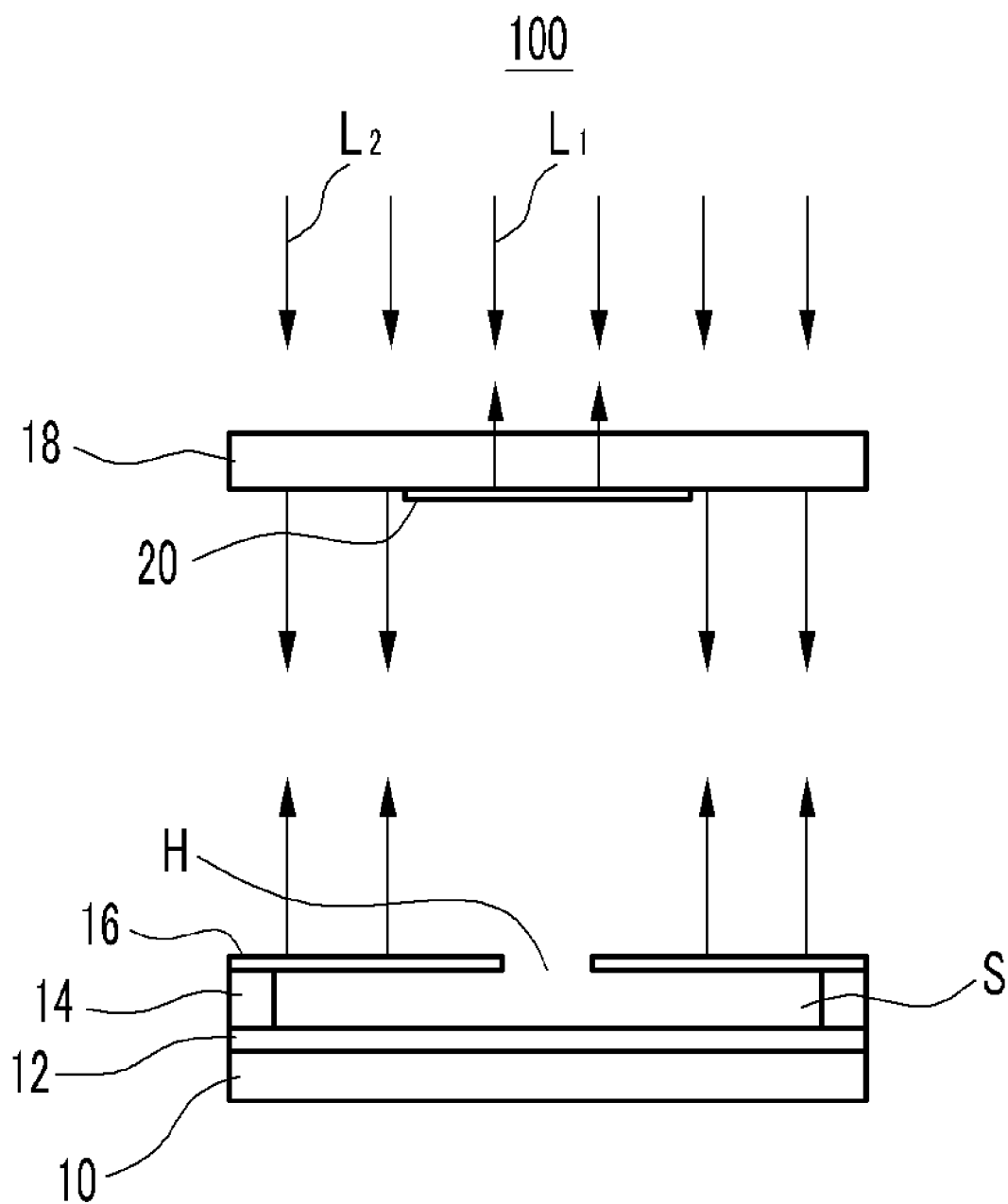
FIG. 1 is cross-sectional view explaining a shutter pixel in an 'off' state according to an exemplary embodiment of the present invention.

<Description of Reference Numerals Indicating Primary Elements in the Drawings>

| | |
|---|---|
| 10: | lower substrate |
| 12: | electrode |
| 14: | spacer |
| 16: | first mirror |
| 18: | upper substrate |
| 20: | second mirror |
| 22: | space filter |
| 32: | electrode |
| 50: | light source |
| 60: | projection lens unit |
| 100, 200, 300, 400, 500: | shutter pixel |
| 600, 700: | shutter structure |
| 800: | exposure apparatus |

DETAILED DESCRIPTION OF THE EMBODIMENTS

Exemplary embodiments of the present invention will be hereinafter described in detail with reference to the accompanying drawings. i) The structural shapes, sizes, ratios, numbers, etc. are schematically illustrated in the accompanying drawings such that they may be altered as desired. ii) The drawings are shown from a selected observation point; however, the direction or location of explaining the drawings may be varied depending upon the position of the observer. iii) Even when reference is made to different elements, like reference numerals may be used to designate those elements. iv) When the terms "include," "have," "consist of," or the like are used, the relevant subject may include other parts unless the term "only" is used to define the contents thereof. v) When an explanation is made by way of a singular term, it may be interpreted in a plural manner as well as in a singular manner. vi) Even when the numerical values, shapes, size comparisons, positional relations, etc. are not explained with the adverb "about" or "substantially," they may be so interpreted to include the common error ranges. vii) Even when the terms "after," "before," "and," "here," "subsequently," or the like are introduced, they are not meant to define temporal locations. viii) The terms "the first," "the second,"..., etc. are used only for convenience in distinction selectively, commutatively, or repeatedly, and are not meant to be read in any defined manner. ix) It will be understood that when an element is referred to as being "on," "over," "above," "below," or "beside" another element, it can be directly on the other element or one or more intervening elements may also be present. x) When the connective term "or" is used to relate two elements, it is meant to indicate the respective elements and a combination thereof, but when the quantifier "any one of" is attached to the connective term "or", it is meant to indicate only the respective elements.

Figure 2:
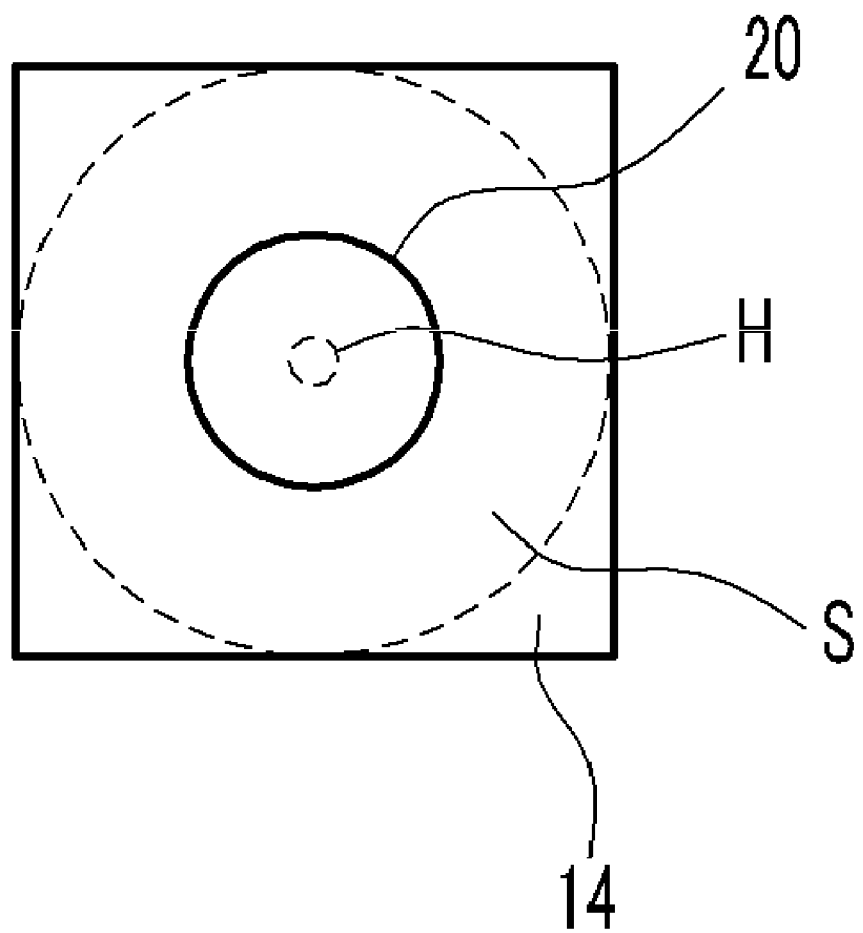
FIG. 2 is a top plan view of the shutter pixel shown in FIG. 1.

FIG. 1 is a cross-sectional view explaining a shutter pixel in an 'off' state according to an exemplary embodiment of the present invention. FIG. 2 is a top plan view of the shutter pixel shown in FIG. 1.

Referring to FIGS. 1 and 2, a shutter pixel 100 includes a lower substrate 10, an electrode 12, a spacer 14, a first mirror 16, an upper substrate 18, and a second mirror 20.

The lower substrate 10 may include a transparent material. For example, the transparent material may be a glass group material including silica. The electrode 12 is formed on the lower substrate 10. The electrode 12 may include a transparent conductive material. In one embodiment of the present invention, the transparent conductive material may be indium tin oxide (ITO) or indium zinc oxide (IZO).

The spacer 14 is formed on the electrode 12. In one embodiment of the present invention, the spacer 14 may be formed on the edge of the electrode 12. In this case, as shown in FIG. 2, a space S with a circular cylinder shape may be defined by the spacer 14.

The first mirror 16 is formed on the spacer 14. The first mirror 16 may include a reflective conductive material. In one embodiment of the present invention, the reflective conductive material may be aluminum (Al).

The spacer 14 is disposed between the electrode 12 and the first mirror 16 such that the first mirror 16 is separated from the electrode 12. In detail, the first mirror 16 and the electrode 12 are separated by the space S with the circular cylinder shape defined by the spacer 14.

The first mirror 16 has a flat, plate shape. Also, the first mirror 16 may include a hole H. For example, the hole H may be formed on the center of the first mirror 16. Here, the hole H may communicate with the space S of the circular cylinder shape.

The upper substrate 18 is disposed on the lower substrate 10 to correspond to the lower substrate 10. The upper substrate 18 may include substantially the same material as the lower substrate 10. In detail, the lower substrate 10 may include the transparent material such as the glass group material including silica.

The second mirror 20 may be formed on the upper substrate 18. In detail, the second mirror 20 may be disposed on the surface of the upper substrate 18 facing the lower substrate 10. The second mirror 20 may include substantially the same material as the first mirror 16. In detail, the second mirror 20 may include a reflective conductive material such as aluminum.

The second mirror 20 may have a plate shape. Also, when the second mirror 20 is projected on the first mirror, from a top plan view, the outer line of the second mirror 20 may be disposed within the outer line of the first mirror 16 (cf. FIG. 2).

For example, the second mirror 20 may overlap the hole H formed in the first mirror 16. In detail, referring to FIG. 2, the second mirror 20 has a width that is larger than the hole H formed in the first mirror 16, and the whole portion of the hole H formed in the first mirror 16 may overlap the second mirror 20.

The shutter pixel 100 may include an application member (not shown) to apply a voltage difference between the electrode 12 and the first mirror 16. Further, the voltage application member may include a switching element such as a transistor.

Next, an "off" state of the shutter pixel 100 will be described.

When no voltage difference is applied between the electrode 12 and the first mirror 16 there is no attractive force between the electrode 12 and the first mirror 16. Thus, the first mirror 16 maintains a flat, plate shape.

A collimated light is provided to the upper substrate 18. The collimated light includes first light L1, provided at the portion where the second mirror 20 of the upper substrate 18 is formed, and second light L2 provided at the portion where the second mirror 20 is not formed.

The first light L1 is reflected by the second mirror 20 and exits the shutter pixel 100. The second light L2 is provided inside the shutter pixel 100; however, it is reflected by the first mirror 16 and exits the shutter pixel 100.

As a result, less than all of the collimated light provided on the upper substrate 18 passes through the shutter pixel 100. That is, the collimated light does not enter the hole H formed at the first mirror 16 and the shutter pixel 100 maintains the off state.

This is because the second mirror 20 has a width that is larger than the hole H formed in the first mirror 16. In other words, the whole portion of the hole H formed in the first mirror 16 overlaps the second mirror 20, and while the first mirror 16 has a flat, plate shape, all the light L2 provided to the first mirror 16 is reflected out of the shutter pixel.

Figure 3:
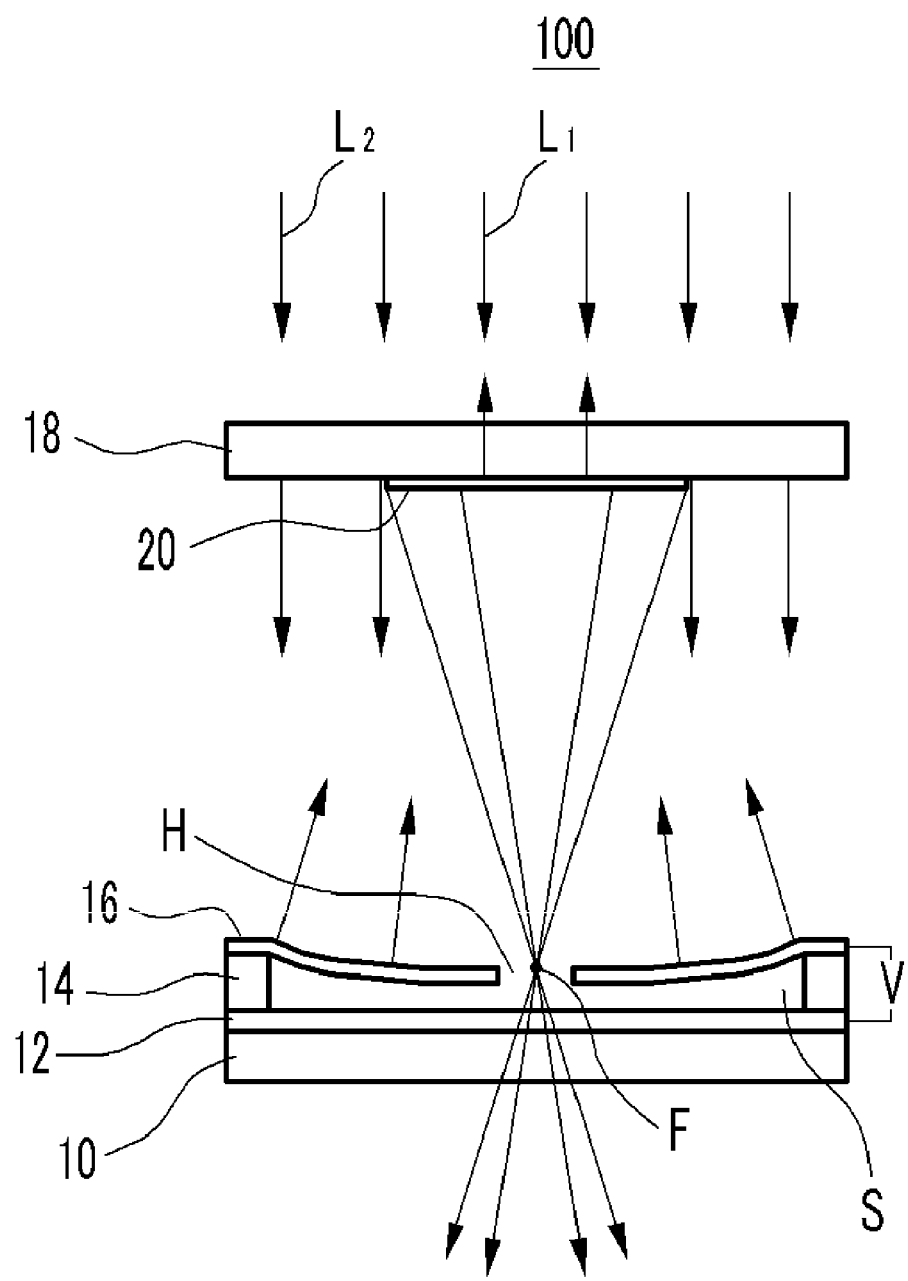
FIG. 3 is a cross-sectional view explaining an 'on' state of the shutter pixel shown in FIG. 1.

FIG. 3 is a cross-sectional view depicting an "on" state of the shutter pixel shown in FIG. 1.

Referring to FIG. 3, a voltage V is applied between the electrode 12 and the first mirror 16 through the voltage application member. In this case, an attractive force is generated between the electrode 12 and the first mirror 16 such the first mirror 16 bends to become closer to the electrode 12. The portion of the first mirror 16 around the hole H bends more than the edge portion, and thus the first mirror 16 acquires a concave shape.

The collimated light is provided through the upper substrate 18. The collimated light includes a first light L1, provided on the portion where the second mirror 20 of the upper substrate 18 is formed, and a second light L2 provided on the portion where the second mirror 20 is not formed.

The collimated light is provided through the upper substrate 18. The first light L1 is reflected by the second mirror 20 and exits the shutter pixel 100. The second light L2 reaches the inside region of the shutter pixel 100, and is reflected by the first mirror 16 with the concave shape to be directed to the second mirror 20. The second light L2 is reflected by the second mirror 20, and is directed into the hole H formed at the first mirror 16, such that it passes through the hole H and forms a focus point, F. Accordingly, the shutter pixel 100 is in the "on" state.

Figure 4:
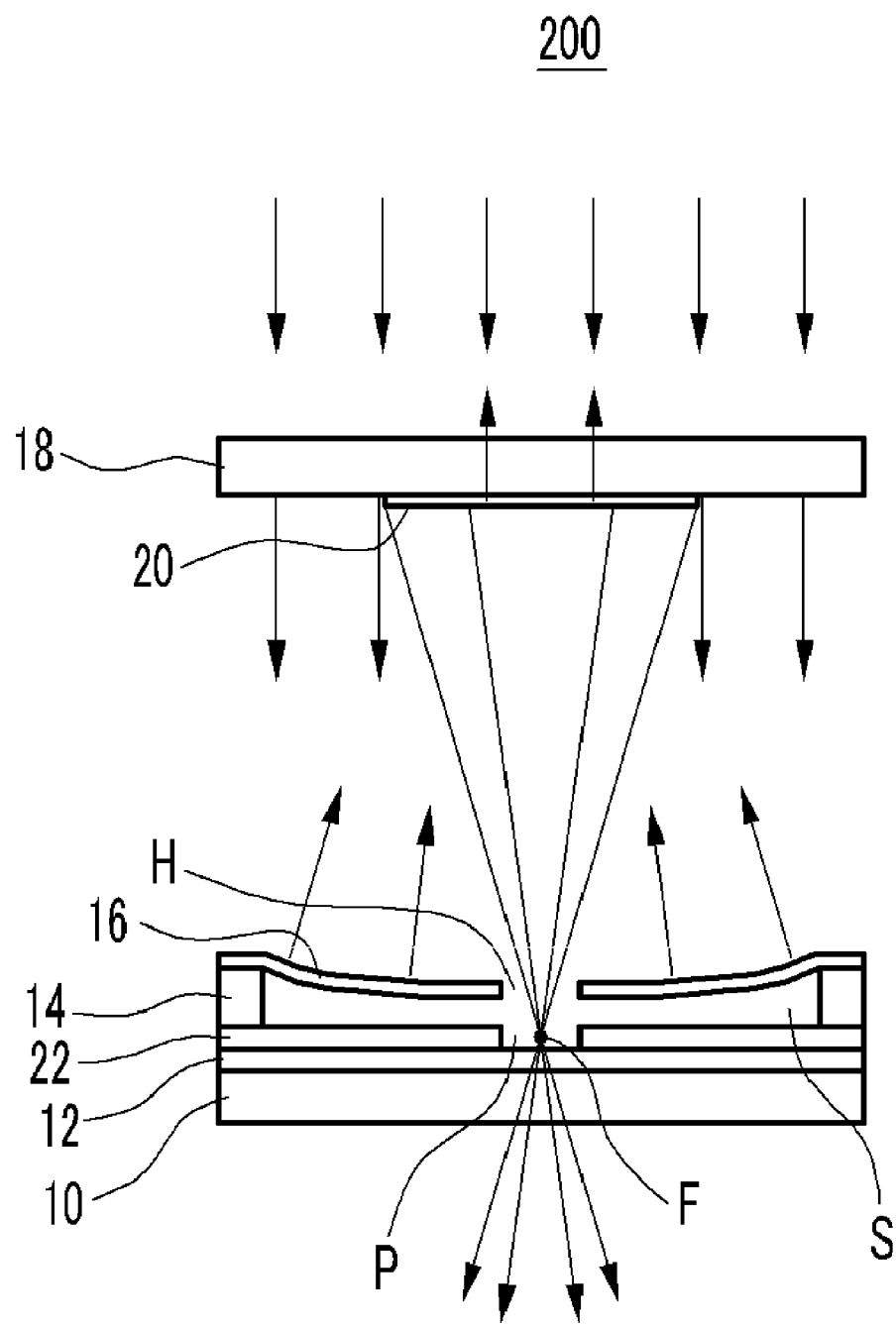
FIG. 4 is a cross-sectional view explaining a shutter pixel according to another exemplary embodiment of the present invention.

FIG. 4 is a cross-sectional view explaining a shutter pixel according to another exemplary embodiment of the present invention.

A shutter pixel 200 according to the exemplary embodiment shown in FIG. 4 may be substantially the same as the shutter pixel 100 shown in FIG. 1 except for a space filter 22. Accordingly, the same components are indicated by the same reference numbers, and the descriptions thereof are omitted.

Referring to FIG. 4, the shutter pixel 200 further includes a space filter 22 disposed between the electrode 12 and the spacer 14. The space filter 22 may include an opaque material. The space filter 22 has an opening P overlapping the hole H formed in the first mirror 16. In detail, the opening P is disposed under the hole H, and may be smaller than the hole H.

When the space filter 22 is applied, the focus F is formed on an opening P such that the peripheral light that does not pass through the opening P is removed as noise, thereby increasing the optical resolution.

Also, the opaque material included in the space filter 22 may have an insulating characteristic in the present exemplary embodiment. In this case, although a voltage V is applied to the electrode 12 and the first mirror 16 and the first mirror 16 has the concave shape thereby forming the "on" state, the space filter 22 is disposed between the electrode 12 and the first mirror 16 such that that an electrical short between the electrode 12 and the first mirror 16 may be prevented.

Figure 5:
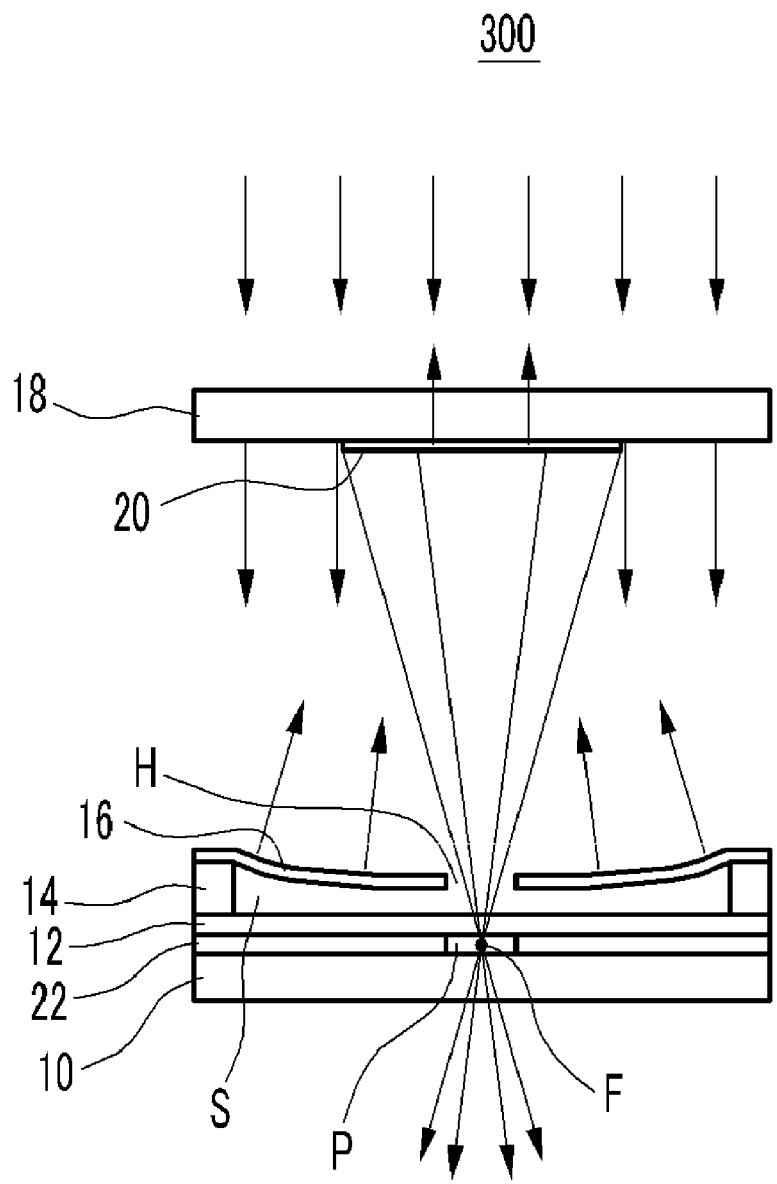
FIG. 5 is a cross-sectional view explaining a shutter pixel according to another exemplary embodiment of the present invention.

FIG. 5 is a cross-sectional view explaining a shutter pixel according to another exemplary embodiment of the present invention.

A shutter pixel 300 according to the present exemplary embodiment is substantially the same as the shutter filter 200 explained in the FIG. 4 except for the position of the space filter 22. Accordingly, the same components are indicated by the same reference numbers, and the descriptions thereof are omitted.

Referring to FIG. 5, the space filter 22 included in the shutter pixel 300 is disposed between the lower substrate 10 and the electrode 12. In this case, the space filter 22 is not interposed between the first mirror 16 and the electrode 12 such that the shutter pixel 300 may form the "on" state even when a relatively small voltage difference is generated between the first mirror 16 and the electrode 12.

Figure 6:
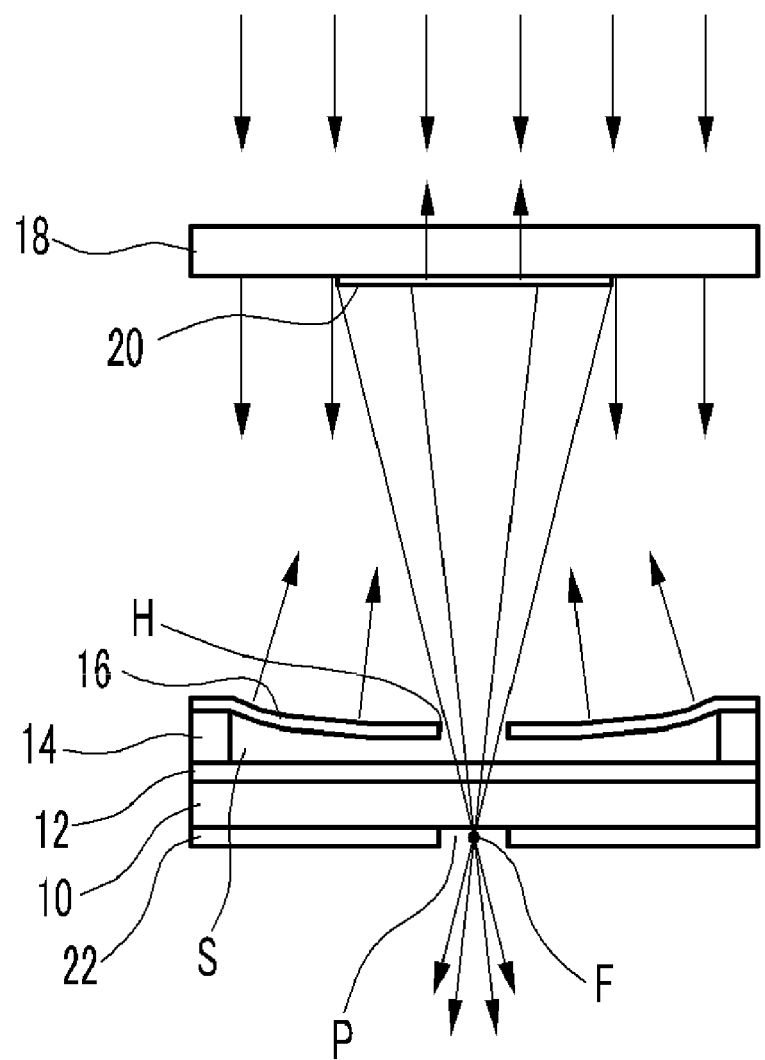
FIG. 6 is a cross-sectional view explaining a shutter pixel according to another exemplary embodiment of the present invention.

FIG. 6 is a cross-sectional view explaining a shutter pixel according to another exemplary embodiment of the present invention.

A shutter pixel 400 according to the present exemplary embodiment is substantially the same as the shutter filter 200 shown in FIG. 4, except for the position of the space filter 22. Accordingly, the same components are indicated by the same reference numbers, and the descriptions thereof are omitted.

Referring to FIG. 6, the space filter 22 included in the shutter pixel 400 is located under the lower substrate 10. In detail, the space filter 22 is formed on the lower surface of the lower substrate 10. In this case, the space filter 22 may not be interposed between the first mirror 16 and the electrode 12 such that the shutter pixel 400 may form the "on" state, even when a relatively small voltage difference is generated between the first mirror 16 and the electrode 12. Also, in the present exemplary embodiment, the space filter 22 is disposed under the lower substrate 10. Therefore, an improvement in optical resolution in the shutter pixel 400 over the embodiment depicted in FIG. 5 is obtained. This is because in FIG. 5 the lower substrate 10 is placed under the space filter 22, thus allowing the light rays to spread somewhat, before leaving the shutter pixel. On the contrary, in the embodiment depicted in FIG. 6, with the space filter 22 disposed under the lower substrate 10, the light rays leave the shutter pixel at the focal point F, thus providing enhanced optical resolution.

Figure 7:
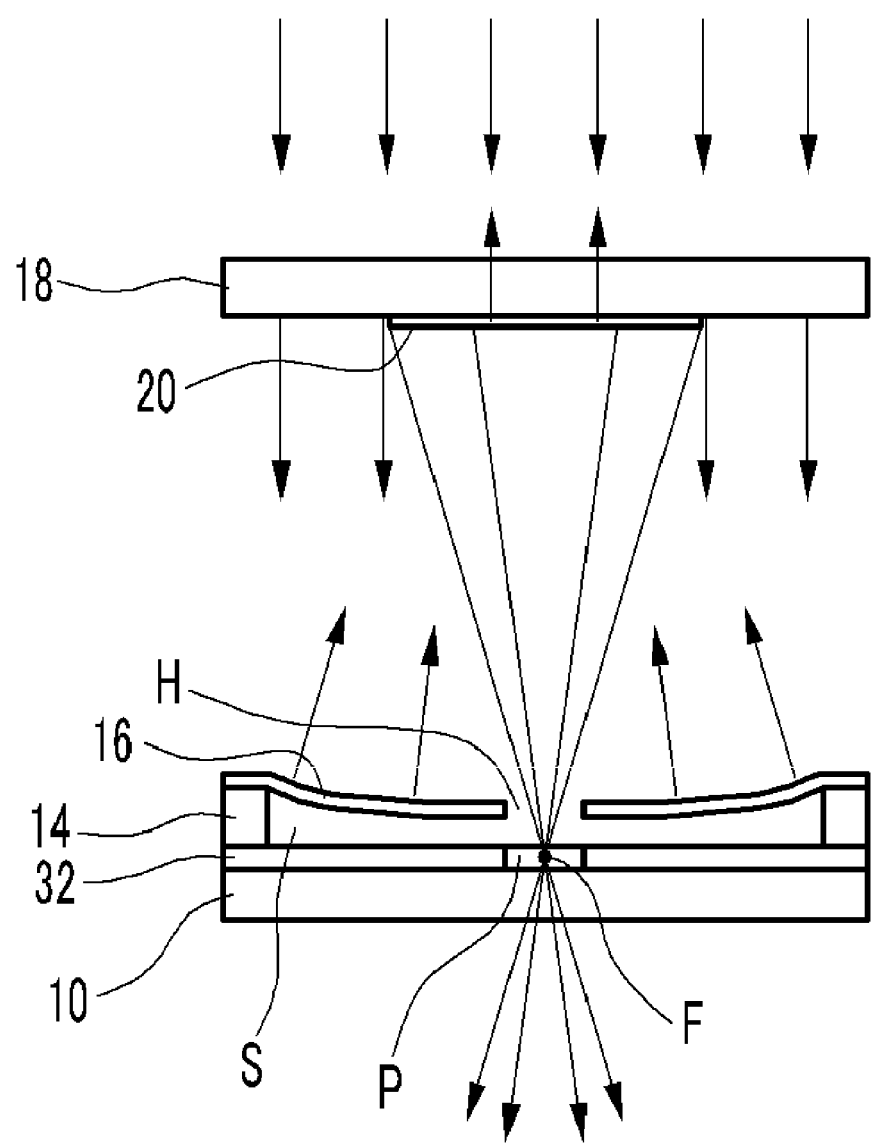
FIG. 7 is a cross-sectional view explaining a shutter pixel according to another exemplary embodiment of the present invention.

FIG. 7 is a cross-sectional view explaining a shutter pixel according to another exemplary embodiment of the present invention.

A shutter pixel 500 according to the present exemplary embodiment is substantially the same as the shutter pixel 100 shown in FIG. 1, except for an electrode 32. Accordingly, the same components are indicated by the same reference numbers, and the descriptions thereof are omitted.

Referring to FIG. 7, the electrode 32 may be formed between the lower substrate 10 and the spacer 14 by using an opaque conductive material. The electrode 32 has an opening P vertically overlapping the hole H of the first mirror 16.

In the present exemplary embodiment, the electrode 32 includes the opaque conductive material such that the electrode 32 simultaneously has the functions of the electrode 12 shown in FIGS. 1, 3, 4, 5, and 6, and the space filter 22 shown in FIGS. 4, 5, and 6. Accordingly, the structure of the shutter pixel 500 is simplified.

Figure 8:
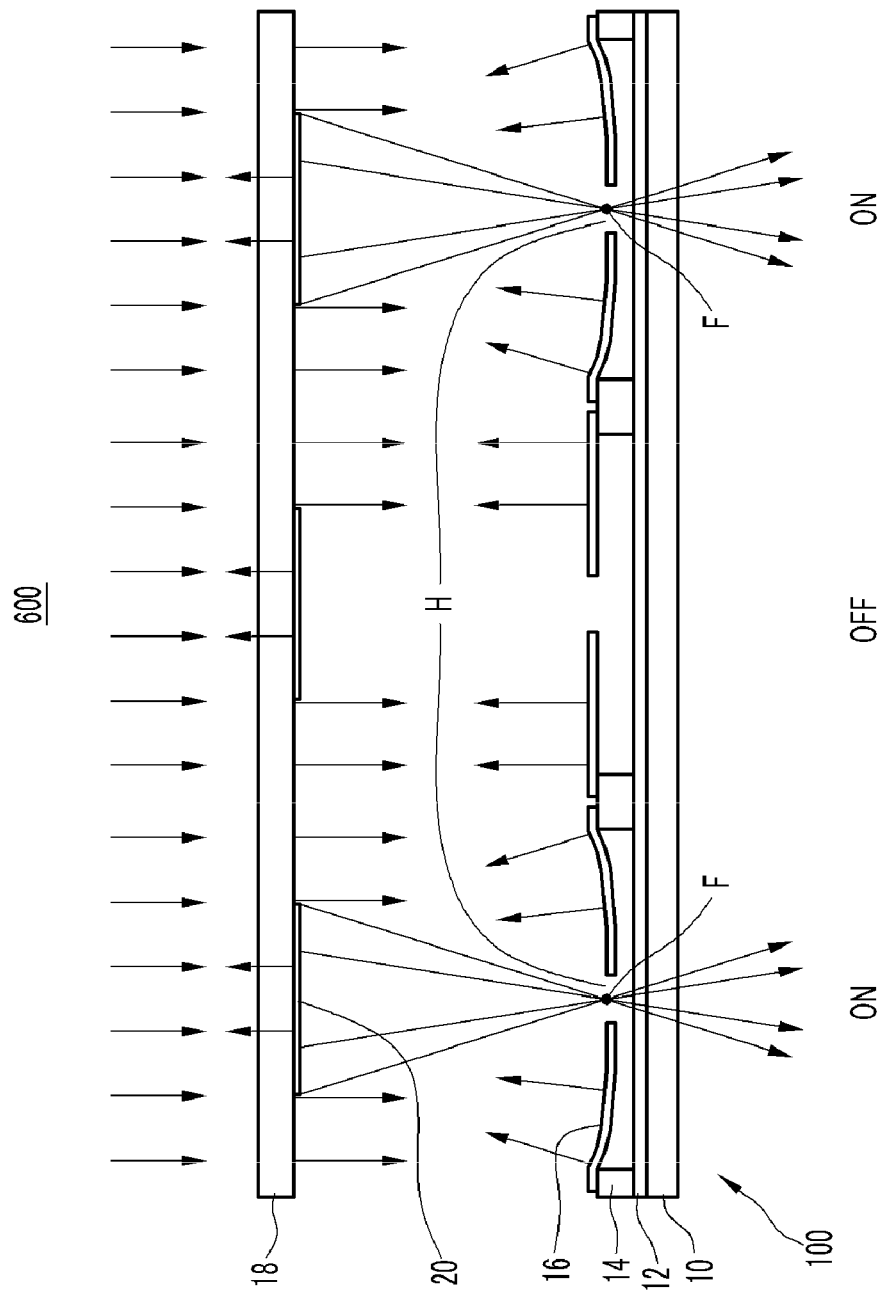
FIG. 8 is a cross-sectional view explaining a shutter structure according to an exemplary embodiment of the present invention.

FIG. 8 is a cross-sectional view explaining a shutter structure according to an exemplary embodiment of the present invention.

Referring to FIG. 8, a shutter structure 600 includes a plurality of shutter pixels 100 shown in FIGS. 1 to 3. The shutter pixels 100 are described through FIGS. 1 to 3 such that the description thereof is omitted.

The shutter pixels 100 of the shutter structure 600 are arranged in a row direction and a column direction. For example, the shutter pixels 100 may be arranged in a matrix form. The shutter pixels 100 may be independently driven. That is, a portion of the shutter pixels 100 may be in the "on" state, and the rest may be in the "off" state. Accordingly, various images may be realized.

Again referring to FIGS. 1 and 8, the lower substrates 10 and the upper substrates 18 may be integrally formed with a flat, plate shape in the shutter structure 600. The spacers 14 may be integrally formed. The second mirrors 20 may be formed to be separated from each other.

Here, the electrodes 12 are integrally formed with a continuous flat, plate shape. However, the first mirrors 16 are formed separated from each other. Accordingly, it is possible for the voltages to be independently applied to each of the shutter pixels 100, in order to selectively drive the shutter pixels 100. For example, the electrode 12 is grounded, and a portion selected among the first mirrors 16 are applied with a voltage and thereby the selective driving may be realized.

The shutter structure 600 according to the present exemplary embodiment includes the shutter pixel 100 shown in FIGS. 1 to 3, however it may include the shutter pixel 200 shown in FIG. 4, the shutter pixel 300 shown in FIG. 5, the shutter pixel 400 shown in FIG. 6, or the shutter pixel 500 shown in FIG. 7.

Figure 9:
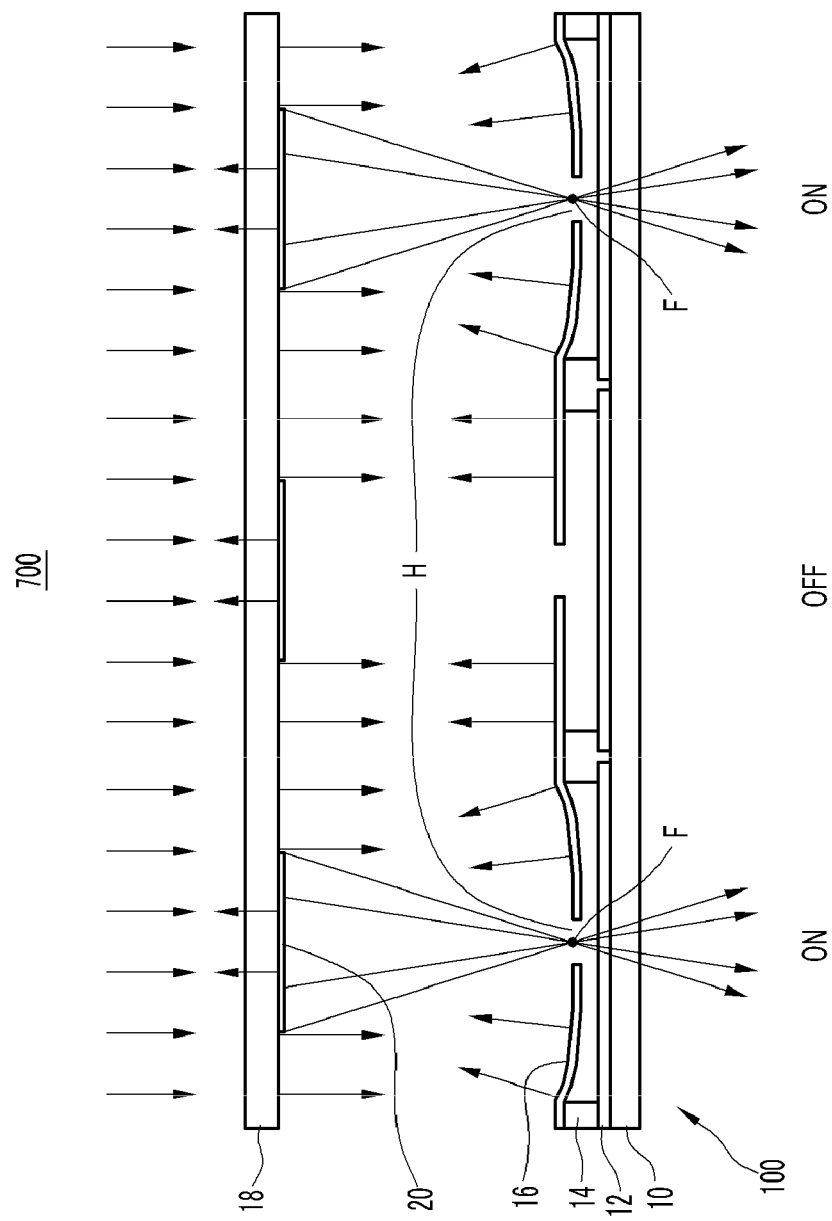
FIG. 9 is a cross-sectional view explaining a shutter structure according to another exemplary embodiment of the present invention.

FIG. 9 is a cross-sectional view explaining a shutter structure 700 according to another exemplary embodiment of the present invention.

The shutter structure 700 according to the present exemplary embodiment is substantially the same as the shutter structure 800 shown in FIG. 8 except for the overall shape of the electrodes 12 and the first mirrors 16. Accordingly, repeated descriptions are omitted.

Again referring to FIGS. 1 and 9, the electrodes 12 are separated from each other. However, the first mirrors 16 are integrally formed. That is, the first mirror 16 of the arbitrary shutter pixel 100 is connected to the first mirror 16 of the neighboring shutter pixel 100. Accordingly, the voltages are independently applied to each shutter pixel 100 such that the shutter pixels 100 may be selectively driven. For example, the first mirror 16 is grounded, and a selected portion from the electrodes 12 may be applied with a voltage to turn "on" a selected group of shutter pixels.

According to yet another exemplary embodiment of the present invention, the electrodes 12 may be formed to be separated from each other, and the first mirrors 16 may be formed to be separated from each other, to selectively drive the shutter pixels 100.

Figure 10:
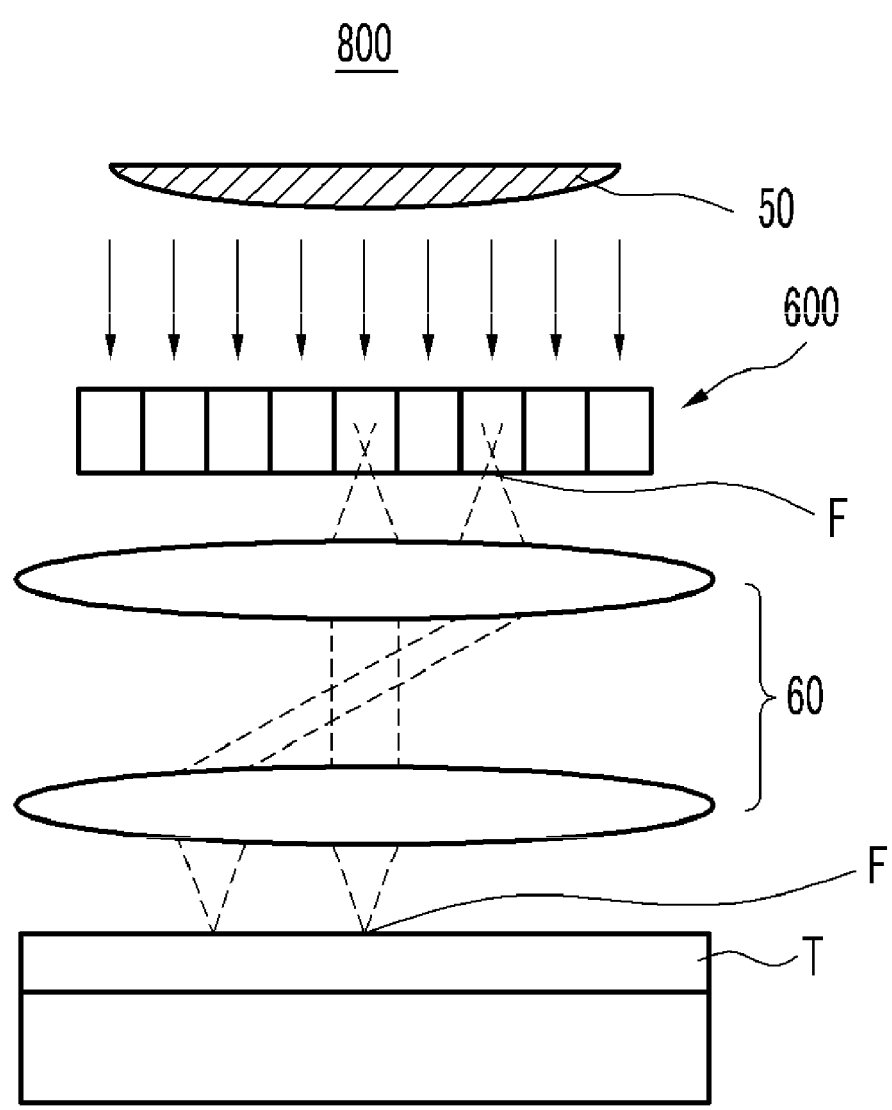
FIG. 10 is a cross-sectional view explaining an exposure apparatus according to an exemplary embodiment of the present invention.

FIG. 10 is a cross-sectional view of an exposure apparatus according to an exemplary embodiment of the present invention.

Referring to FIG. 10, an exposure apparatus 800 includes a light source 50, a shutter structure 600 shown in FIG. 8, and a projection lens unit 60.

The light source 50 generates collimated light. The collimated light is provided to the shutter structure 600 disposed under the light source 50. The shutter structure 600 is described through FIG. 8 such that the description thereof is omitted. The projection lens unit 60 is formed under the shutter structure 600. The projection lens unit 60 projects the focus F formed at the shutter structure 600 to the exposure object matter T.

In the present exemplary embodiment, the exposure apparatus 800 includes the shutter structure 600 shown in FIG. 8. In yet another exemplary embodiment, the exposure apparatus 800 may include the shutter structure 700 shown in FIG. 9.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A shutter pixel comprising:
a lower substrate;
an electrode disposed on the lower substrate;
a spacer disposed on the edge of the electrode;
a first mirror disposed on the spacer to be separated from the electrode and including a hole;
an upper substrate disposed on the lower substrate to face the lower substrate; and
a second mirror disposed at the upper substrate and overlapping the hole.

2. The shutter pixel of claim 1, further comprising
a voltage application member applying a voltage between the electrode and the first mirror.

3. The shutter pixel of claim 2, wherein
when a voltage is applied between the electrode and the first mirror, the first mirror becomes close to the electrode from the portion where the hole is disposed, thereby forming a concave shape.

4. The shutter pixel of claim 1, wherein
the second mirror is disposed on the surface of the upper substrate facing the lower substrate.

5. The shutter pixel of claim 4, wherein
when the second mirror is projected on the first mirror, the outer line of the second mirror is disposed inside the outer line of the first mirror.

6. The shutter pixel of claim 1, wherein
the electrode includes a transparent conductive material.

7. The shutter pixel of claim 1, further comprising
a space filter having an opening overlapping the hole of the first mirror, and including an opaque material.

8. The shutter pixel of claim 7, wherein
the space filter is disposed between the electrode and the spacer.

9. The shutter pixel of claim 8, wherein
the opaque material has an insulating characteristic.

10. The shutter pixel of claim 7, wherein
the space filter is disposed between the lower substrate and the electrode.

11. The shutter pixel of claim 7, wherein
the space filter is disposed under the lower substrate.

12. The shutter pixel of claim 1, wherein
the electrode includes an opaque conductive material, and has an opening overlapping the hole of the first mirror.

13. A shutter structure comprising
a plurality of shutter pixels arranged in row and column directions,
wherein each shutter pixel includes a lower substrate, an electrode disposed on the lower substrate, a spacer disposed on the edge of the electrode, a first mirror disposed on the spacer to be separated from the electrode and including a hole, an upper substrate on the lower substrate to face the lower substrate, and a second mirror disposed under the upper substrate and overlapping the hole.

14. The shutter structure of claim 13, wherein
the electrodes are integrally formed with a flat, plate shape, and connected to each other, and
the first mirrors are formed to be separated from each other.

15. The shutter structure of claim 13, wherein
the electrodes are formed to be separated from each other, and
the first mirrors are connected to each other.

16. The shutter structure of claim 13, wherein
the electrodes are formed to be separated from each other, and
the first mirrors are formed to be separated from each other.

17. The shutter structure of claim 13, wherein
the upper substrates are integrally formed with a flat, plate shape,
the lower substrates are integrally formed with a flat, plate shape, and
the spacers are integrally formed.

18. The shutter structure of claim 13, wherein
each shutter pixel further includes a voltage application member applying a voltage between the electrode and the first mirror.

19. The shutter structure of claim 18, wherein
the first mirror becomes close to the electrode from the portion where the hole is formed thereby forming a concave shape by the voltage applied between the electrode and the first mirror, and
the voltage is applied between the electrode and the first mirror of the portion selected from the shutter pixels.

20. An exposure apparatus comprising:
a light source generating collimated light;
a shutter structure provided with the collimated light; and
a projection lens unit formed under the shutter structure and projecting a focus formed at the shutter structure by the collimated light to an exposure object matter,
wherein the shutter structure includes a plurality of shutter pixels arranged in row and column directions, each of said shutter pixels including a lower substrate, an electrode disposed on the lower substrate, a spacer disposed on the edge of the electrode, a first mirror disposed on the spacer to be separated from the electrode and including a hole, an upper substrate disposed on the lower substrate to face the lower substrate, and a second mirror disposed under the upper substrate and overlapping the hole.

* * * * *